United States Patent
Kidokoro et al.

(10) Patent No.: US 7,535,739 B2
(45) Date of Patent: May 19, 2009

(54) SEMICONDUCTOR SWITCH

(75) Inventors: Hiroyasu Kidokoro, Kariya (JP); Yoshihiro Watanabe, Kariya (JP)

(73) Assignees: DENSO CORPORATION, Kariya (JP); Advics Co., Ltd., Kariya (JP)

( * ) Notice: Subject to any disclaimer, the term of this patent is extended or adjusted under 35 U.S.C. 154(b) by 97 days.

(21) Appl. No.: 11/062,937

(22) Filed: Feb. 22, 2005

(65) Prior Publication Data
US 2005/0184715 A1 Aug. 25, 2005

(30) Foreign Application Priority Data
Feb. 24, 2004 (JP) ............................. 2004-048066

(51) Int. Cl.
*H02M 7/04* (2006.01)
(52) U.S. Cl. .................. 363/89; 363/81; 323/222; 323/285
(58) Field of Classification Search ......... 323/282–285, 323/315, 907, 273–274, 265, 267, 272, 276; 315/160, 175; 340/660–664; 363/17, 20, 363/87, 89, 95; 307/570, 572, 270, 66, 64
See application file for complete search history.

(56) References Cited

U.S. PATENT DOCUMENTS

| | | | |
|---|---|---|---|
| 4,707,758 A | | 11/1987 | Matsuda |
| 4,890,002 A | * | 12/1989 | Schornack .................. 307/66 |
| 5,384,516 A | * | 1/1995 | Kawabata et al. ........... 315/160 |
| 5,411,324 A | * | 5/1995 | Zydek et al. ........... 303/122.05 |
| 5,648,759 A | * | 7/1997 | Miller et al. ................. 340/660 |
| 5,754,386 A | * | 5/1998 | Barbour et al. ............. 361/154 |
| 5,898,554 A | * | 4/1999 | Schnetzka et al. ............. 361/18 |
| 6,208,242 B1 | | 3/2001 | Engelmann et al. |
| 6,369,556 B1 | * | 4/2002 | Ohshima .................... 323/282 |
| 6,782,961 B1 | * | 8/2004 | Ishikawa et al. ............ 180/197 |
| 2004/0075423 A1 | | 4/2004 | Itabashi et al. |

FOREIGN PATENT DOCUMENTS

| | | |
|---|---|---|
| DE | 44 02 017 | 7/1994 |
| DE | 44 36 372 | 4/1996 |
| DE | 197 51 429 | 11/1997 |
| EP | 075 931 | 4/1983 |
| JP | 08-104221 | 4/1996 |

(Continued)

OTHER PUBLICATIONS

Japanese Examination Report dated Mar. 7, 2008 for corresponding Japanese Patent Application No. 2004-048066 and English translation thereof.
German Examination Report dated Mar. 4, 2008 for corresponding German Application No. 10 2005 006867.7-34 and English translation thereof.

(Continued)

*Primary Examiner*—Rajnikant B Patel
(74) *Attorney, Agent, or Firm*—Harness, Dickey & Pierce, PLC

(57) ABSTRACT

A semiconductor switch interrupts output when a microcomputer or an external IC operates abnormally is connected to a control device such, and is turned on or off depending upon a control signal from the control device. The semiconductor switch has feed voltage-monitoring means for monitoring whether the voltage fed to the control device lies within a predetermined range, and is turned off when it is so judged that the voltage is not within the predetermined range.

12 Claims, 7 Drawing Sheets

FOREIGN PATENT DOCUMENTS

| | | |
|---|---|---|
| JP | 10-014089 | 1/1998 |
| JP | A 11 017508 | 1/1999 |
| JP | 2003-088093 | 3/2003 |
| JP | 2003-218382 | 7/2003 |

OTHER PUBLICATIONS

Office Action from German Patent Office dated Jul. 4, 2008 in the corresponding German Patent Application No. 102005006867.7.

* cited by examiner

SEMICONDUCTOR SWITCH

CROSS REFERENCE TO RELATED APPLICATION

This application is based upon, claims the benefit of priority of, and incorporates by reference the contents of Japanese Patent Application No. 2004-48066 filed on Feb. 24, 2004.

FIELD OF THE INVENTION

The present invention relates to a semiconductor switch for interrupting a circuit between the input side and the output side depending upon the state.

BACKGROUND OF THE INVENTION

Switching devices have been widely used, such as an intelligent switch and a relay switch, for selectively feeding the power supply to the loads. In recent years, semiconductor switches are mainly using diodes, bipolar transistors and MOSFETs (metal oxide semiconductor field-effect transistors) on account of their durability to substitute for the mechanical switches.

There has been proposed a semiconductor switch including a light-emitting element that emits light in response to input signals, a light-receiving element which produces an electromotive force upon receiving light, a charge/discharge circuit for effecting the charge/discharge control operation depending upon the electromotive force, and an output semiconductor element which varies the impedance depending upon the charge/discharge control operation, and further having a temperature sensor which detects the temperature of the output semiconductor element and produces an interrupting signal, and an interrupting circuit for interrupting the input signal upon receipt of the interrupting signal (see JP-A-2003-218382).

There has further been proposed an intelligent power module including a semiconductor switch and various protection circuits mounted on the same substrate, which detects protection signals produced from various protection circuits, and produces processing signals of forms that differ depending upon the kind of the detected protection signal, which in turn differs according to the degree of trouble that has occurred, so that a suitable processing (on/off control of the semiconductor switch, etc.) can be executed at the receiving side depending upon the degree of trouble (see JP-A-2003-88093).

Further, there has been proposed an intelligent power switch and a switching device having an overcurrent protection function and an overheat protection function in order to quickly judge whether the semiconductor switch is turned off or whether the load is opened so that parts can be quickly replaced or repaired. The device is capable of quickly judging if no power supply is fed to the load due to the protection function causing the semiconductor switch to be turned off or if no power supply is fed to the load due to because the load is opened, relying upon a simple constitution (see Japanese Patent No. 3285120).

The semiconductor switch switches between outputting and not outputting voltage from the power supply to, for example, an actuator, based on a control signal such as output voltage from a microcomputer or the like. However, because the semiconductor switch cannot judge whether the microcomputer is properly operating, a separate monitoring means to monitor output voltage from the microcomputer is separately installed. This monitoring means stops output to the actuator if voltage supplied to the microcomputer exceeds a certain value. The semiconductor switch also stops output if there is excessive voltage from the power supply, through a self protection function.

According to a method of separately providing monitoring means (or circuit) for monitoring a voltage applied to a microcomputer, the number of parts increases by the provision of the monitoring circuit, thereby causing an increase in the cost of production. Therefore, a circuit board mounting a microcomputer, a semiconductor switch and any other circuitry often employs a method of mutual monitoring, such as exchanging predetermined signals between the microcomputer and a power supply circuit, an input signal processing circuit, an actuator drive circuit or an IC which includes them is required.

However, it is a trend to form ICs of these power supply circuit, input signal processing circuit and actuator drive circuit integrally with their peripheral circuits, making it difficult to realize the mutual monitoring. At present, there have been proposed many ICs that are isolated and arranged depending upon their functions enabling the mutual monitoring to be accomplished. However, with the mutual monitoring in the same IC, it is difficult to guarantee perfect independence between the monitoring side and the to-be-monitored side, which may not be considered to be reliable enough in the fields where the safety is very important (such as controlling the brakes of automobiles).

It is not possible for the conventional semiconductor switches to judge whether the input signals are normal when the mutual monitoring cannot be performed sufficiently. Therefore, even when the microcomputer operates abnormally, the switching is executed according to signals output from the microcomputer. Therefore, depending upon the switching state, the circuit or the actuator connected to the semiconductor switch is often damaged.

SUMMARY OF THE INVENTION

In accordance with the above-mentioned problems, it is an object to provide a semiconductor switch capable of interrupting the output when a microcomputer or an external IC operates abnormally.

According to a first aspect, the semiconductor switch is connected to a control device such as a microcomputer and is turned on or off depending upon a control signal from the control device. The semiconductor switch has feed voltage-monitoring means for monitoring whether a voltage fed to the control device lies within a predetermined range, and is turned off when it is so judged that the voltage is not lying within the predetermined range.

The semiconductor switch cannot easily be integrated, since a heavy current flows therethrough. Therefore, if the semiconductor switch is furnished with the IC monitoring function, this compensates for the decrease in the number of ICs or devices that can monitor each other caused by the integration.

The control device is judged to be normally operating when the voltage applied to the control device such as the microcomputer lies within a predetermined range. When the applied voltage is not within the predetermined range, the semiconductor switch is turned off owing to the above constitution, and no power supply is fed to the circuit or to the actuator connected to the semiconductor switch. Thereby, it becomes possible to prevent abnormal operation in, or damage to, the circuit or the actuator connected to the semiconductor switch or, further, to the load connected to the actuator. Further, there is no need to newly provide a monitoring circuit on the outside of the control device or the semiconductor switch, and a monitoring constitution can be realized at a low cost while maintaining a high degree of safety.

According to a second aspect, the semiconductor switch is connected to a control device, such as a microcomputer, which is turned on or off depending upon a control signal from the control device. The semiconductor switch includes output voltage-monitoring means for monitoring whether a voltage output to the semiconductor switch from the control device is within a predetermined range, and turning off the switch when it is so judged that the voltage is not within the predetermined range.

The control device is judged to be normally operating when a voltage of the control signal is within the predetermined range. When the control signal from the control device is not within the predetermined range, the semiconductor switch is turned off owing to the above constitution, and no power supply is fed to the circuit or the actuator connected to the semiconductor switch, making it possible to prevent abnormal operation in, or damage to, the circuit or the actuator connected to the semiconductor switch or, further, to the load connected to the actuator. Further, there is no need of newly providing a monitoring circuit on the outside of the control device or the semiconductor switch, and a monitoring constitution can be realized at a low cost while maintaining a high degree of safety.

According to a third aspect, the feed voltage-monitoring means in the semiconductor switch of the first aspect includes overvoltage-detecting means for detecting if the voltage applied to the control device is greater than a predetermined value, and undervoltage-detecting means for detecting if the voltage applied to the control device is smaller than a predetermined value. Thus, the feed voltage monitoring means monitors if the voltage applied to the control device is greater than the predetermined value or is smaller than the predetermined value.

The control device does not operate and does not send a control signal to the semiconductor switch when the voltage fed to the control device such as the microcomputer is smaller than a predetermined voltage. Therefore, the conventional voltage-monitoring means monitors if the voltage applied to the control device is greater than the predetermined voltage. Even when the voltage applied to the control device is smaller than the predetermined voltage, however, a voltage is often output to the semiconductor switch due to erroneous operation of the peripheral circuit such as the microcomputer. Therefore, according to the present aspect, both a voltage greater than the predetermined voltage and a voltage smaller than the predetermined voltage are monitored to reliably prevent the semiconductor switch from producing a voltage.

According to a fourth aspect, the output voltage-monitoring means in the semiconductor switch of the second aspect includes overvoltage-detecting means for detecting if the voltage output to the semiconductor switch from the control device is greater than a predetermined value, and undervoltage-detecting means for detecting if the voltage output to the semiconductor switch from the control device is smaller than a predetermined value. Thus, the output voltage monitoring means monitors if the voltage output to the semiconductor switch from the control device is greater than the predetermined value or is smaller than the predetermined value. Further, the undervoltage-detecting means may also be used as the input voltage-detecting means. That is, if the semiconductor switch is turned off while the voltage detected by the input voltage-detecting means is smaller than the predetermined voltage, then, even if the undervoltage is not detected, the same effect is obtained.

Conventionally, the output of the semiconductor switch has simply been changed after detecting whether the output voltage from the control device is greater than a predetermined voltage or is smaller than a predetermined voltage. Therefore, the abnormal operation has not been detected when the voltage fed to the control device such as the microcomputer is greater than the predetermined voltage, or when the output voltage to the semiconductor switch becomes too great. However, according to the above aspects, both a voltage greater than the predetermined voltage and a voltage smaller than the predetermined voltage are monitored and the semiconductor switch is reliably prevented from producing a voltage.

According to a fifth aspect, the semiconductor switch includes signal output means which outputs a signal to an external unit when it is so judged that the voltage is not lying within a predetermined range. In case an abnormal operation is detected according to this constitution, the signal is sent to an external circuit or to other ICs enabling the circuit as a whole to be safely ended.

According to a sixth aspect, there is provided an anti-lock braking device for automobiles which temporarily reduces the braking force for the wheels that are locked or are almost locked. Thereby, the wheels are liberated from the locked state in order to prevent the wheels from being locked while applying the brake. The anti-lock braking device includes a fluid pressure pump driven by an electric motor, and an electromagnetic valve on the feed side and an electromagnetic valve on the drain side provided for each of the wheels between the fluid pressure pump and a wheel cylinder for adjusting the pressure of the brake fluid fed from the fluid pressure pump to the wheel cylinder of the brake depending upon the locked state of the wheels. Further, the semiconductor switch of any one of the first to fifth aspects is connected at least either between the power supply feeder line and the drive circuit for the electromagnetic valve of the feed side or between the power supply feeder line and the drive circuit for the electromagnetic valve of the drain side.

If there is erroneous operation in the control device such as the microcomputer, the anti-lock braking device for vehicles causes an erroneous braking operation which may result in an accident. Employment of the semiconductor switch according to the above aspects makes it possible to detect any abnormal operation in the control device at a low cost and to avoid the erroneous braking operation. This helps improve the safety and reliability of the anti-lock braking device for vehicles.

BRIEF DESCRIPTION OF THE DRAWINGS

The above and other objects, features and advantages of the present invention will become more apparent from the following detailed description made with reference to the accompanying drawings. In the drawings.

DESCRIPTION OF THE PREFERRED EMBODIMENTS

An object of interrupting the output when a microcomputer or in an external IC has abnormally operated is realized by using a semiconductor switch which incorporates a circuit for detecting an external abnormal operation to interrupt the output in case an external circuit abnormally operates.

Described below with reference to the drawings is a preferred embodiment in which the semiconductor switch is applied to an anti-lock braking device for vehicles. However, it should be noted that the semiconductor switch is not limited to being applied only to anti-lock braking device for vehicles.

Figure 6:
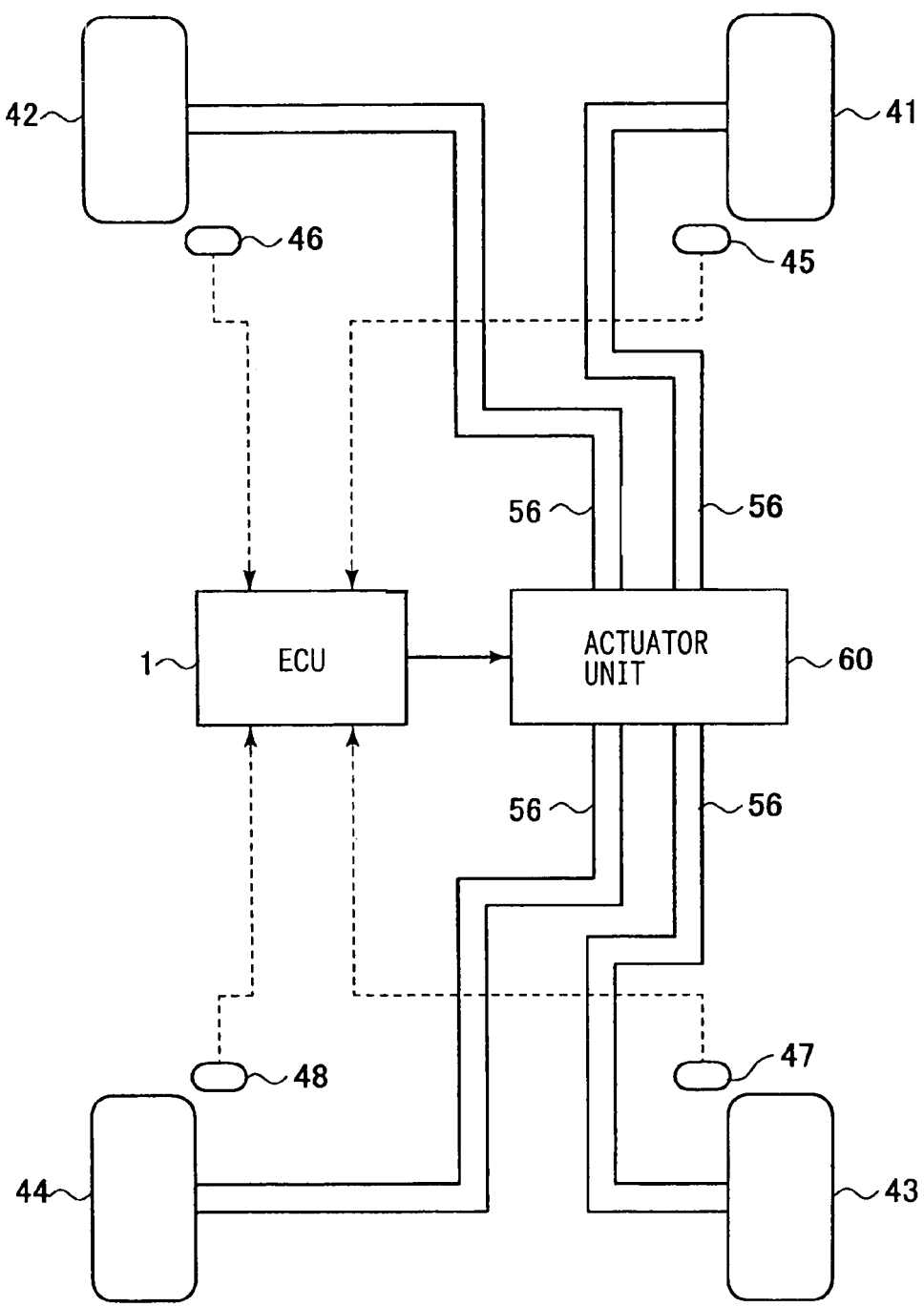
FIG. 6 is a diagram schematically illustrating an anti-lock braking device for vehicles.
Figure 7:
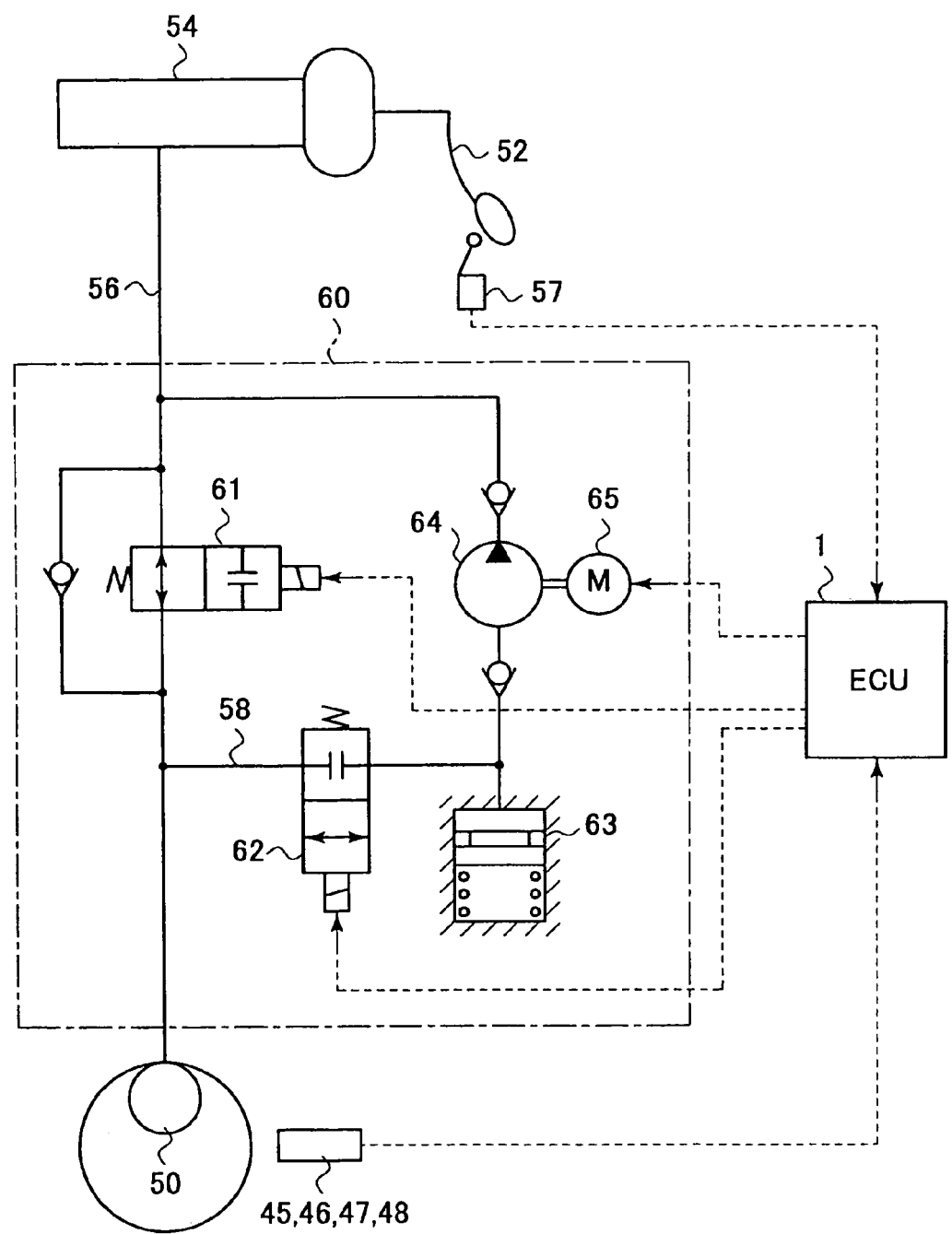
FIG. 7 is a diagram illustrating the constitution of a portion of a brake fluid pressure control circuit.

FIG. 6 is a diagram schematically illustrating an anti-lock braking device for vehicles and FIG. 7 is a diagram illustrating a portion of a brake fluid pressure control circuit. A control device (hereinafter referred to as ECU) 1 including a microcomputer is connected to wheel speed sensors 45 and 46 that send, to the ECU 1, pulse signals depending upon the revolutions of a right front wheel 41 and a left front wheel 42 which are the steered wheels, and wheel speed sensors 47 and 48 that send, to the ECU 1, pulse signals depending upon the revolutions of a right rear wheel 43 and a left rear wheel 44 which are the drive wheels. Wheel cylinders 50 arranged in the wheels 41, 42, 43 and 44 are communicated through main fluid passages 56 with a master cylinder 54 that produces a brake fluid pressure when a brake pedal 52 is depressed by a driver. An actuator unit 60 is interposed midway in the main fluid passages 56 to switch the brake fluid pressures of the wheel cylinders 50. A brake switch 57 is connected to the ECU 1 to detect the depression of the brake pedal 52 and to send an on-signal thereof to the ECU 1.

The actuator unit 60 includes an increased pressure switch control valve (the feed side electromagnetic switch valve) 61 interposed in the main fluid passage 56 for switch controlling an increased fluid pressure in the wheel cylinders 50, a decreased pressure switch control valve (the drain side electromagnetic switch valve) 62 interposed in a decreased pressure passage 58 for switch controlling a decreased pressure, and a reservoir 63 for storing the brake fluid from the wheel cylinders 50 when the pressure in the wheel cylinders 50 has decreased. A pump 64 for returning the brake fluid stored in the reservoir 63 in the actuator unit 60 to the main fluid passage 56, and a motor 65 for driving the pump 64 are interposed between the main fluid passage 56 and the reservoir 63.

The increased pressure switch control valve 61 and the decreased pressure switch control valve 62 are made with electromagnetic valves or solenoids.

The ECU 1 sets in advance the rate of speed reduction of the vehicle from the moment the driver has depressed the brake pedal 52 and executes the anti-lock brake control by automatically adjusting the supply of the brake fluid to, or the drain of the brake fluid from, the wheel cylinders 50 to achieve a wheel speed at which the tire in this state produces a maximum frictional force against the road surface. If this state is maintained, however, the real change in the vehicle speed cannot be grasped. Therefore, the braking force is lowered at regular intervals to return the wheel speed back to the real vehicle speed. From this moment, the rate of speed reduction schedule of the vehicle is reset based on the real rate of speed reduction of the vehicle during the above period, and the supply of the brake fluid to, and the drain of the brake fluid from, the wheel cylinders 50 are changed over to achieve a change in the wheel speed with which the tire in this state produces a maximum frictional force against the road surface.

Figure 1:
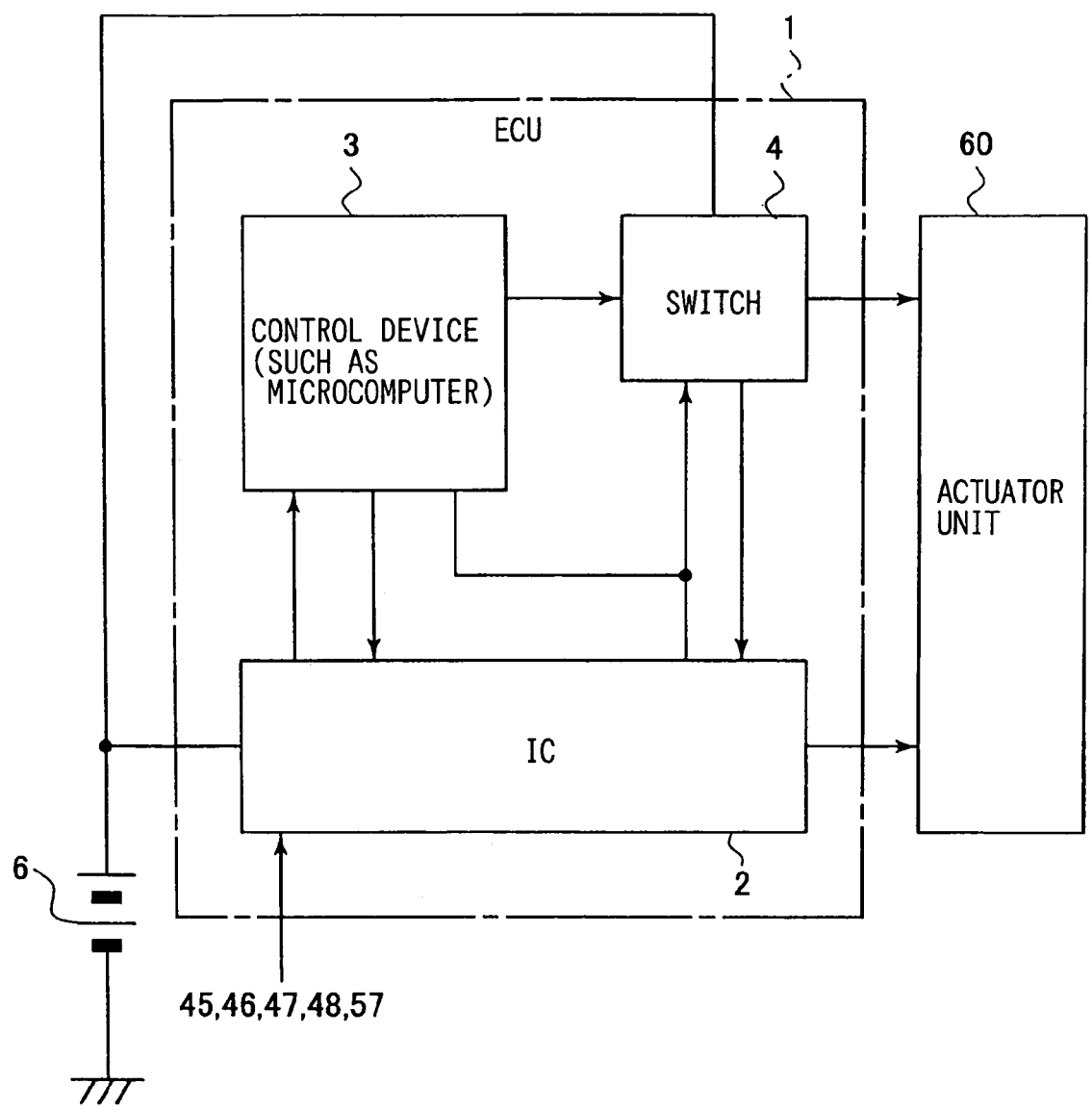
FIG. 1 is a diagram illustrating the constitution of a control device (ECU)

FIG. 1 schematically illustrates the constitution of the ECU 1. The ECU includes a control device 3, which includes a known CPU, a RAM and a ROM. Hereafter, the control device will be represented by a microcomputer. The ECU 1 also includes an IC 2 for converting a power supply from a battery 6 into a predetermined voltage to apply it to various portions of the ECU 1, for receiving signals from the wheel speed sensors 45, 46, 47, 48 and from the brake switch 57, shaping the waveforms thereof and sending them to the microcomputer 3. The IC 2 further includes functions for controlling the drive of the increased pressure switch control valve 61 and the decreased pressure switch control valve 62. The ECU 1 also includes a semiconductor switch 4 for feeding or interrupting the power supply to the increased pressure switch control valve 61 and the decreased pressure switch control valve 62 based on an instruction from the microcomputer 3.

The microcomputer 3 and the IC 2 monitor each other with regard to whether they are abnormally operating, in addition to exchanging the control signals directed to each other. A monitoring method discussed here judges that the to-be-monitored side (e.g., microcomputer 3) is abnormally operating when the monitoring side (e.g., IC 2) receives no pulse signal within a predetermined period of time from the to-be-monitored side which should be transmitting the pulse signal at regular intervals.

The IC 2 outputs the signals from the wheel speed sensors 45, 46, 47, 48 and from the brake switch 57 to the microcomputer 3, and drives the increased pressure switch control valve 61 and the decreased pressure switch control valve 62 in the actuator unit 60 based on a control valve drive signal from the microcomputer 3. The IC 2, further, supplies the power supply to the microcomputer 3. When the voltage monitored by the semiconductor switch 4 is not within a predetermined range, the semiconductor switch 4 sends an output stoppage signal to the IC 2 and supplies the power supply to neither the increased pressure switch control valve 61 nor the decreased pressure switch control valve 62 (details will be described later). The IC 2 that has received the output stoppage signal no longer drives the increased pressure switch control valve 61 or the decreased pressure switch control valve 62. As described above, the microcomputer 3, the IC 2 and the semiconductor switch 4 monitor one another's operations to enhance the reliability and safety of the ECU 1 as a whole.

(Abnormal Operation Detection Method 1)

Figure 2:
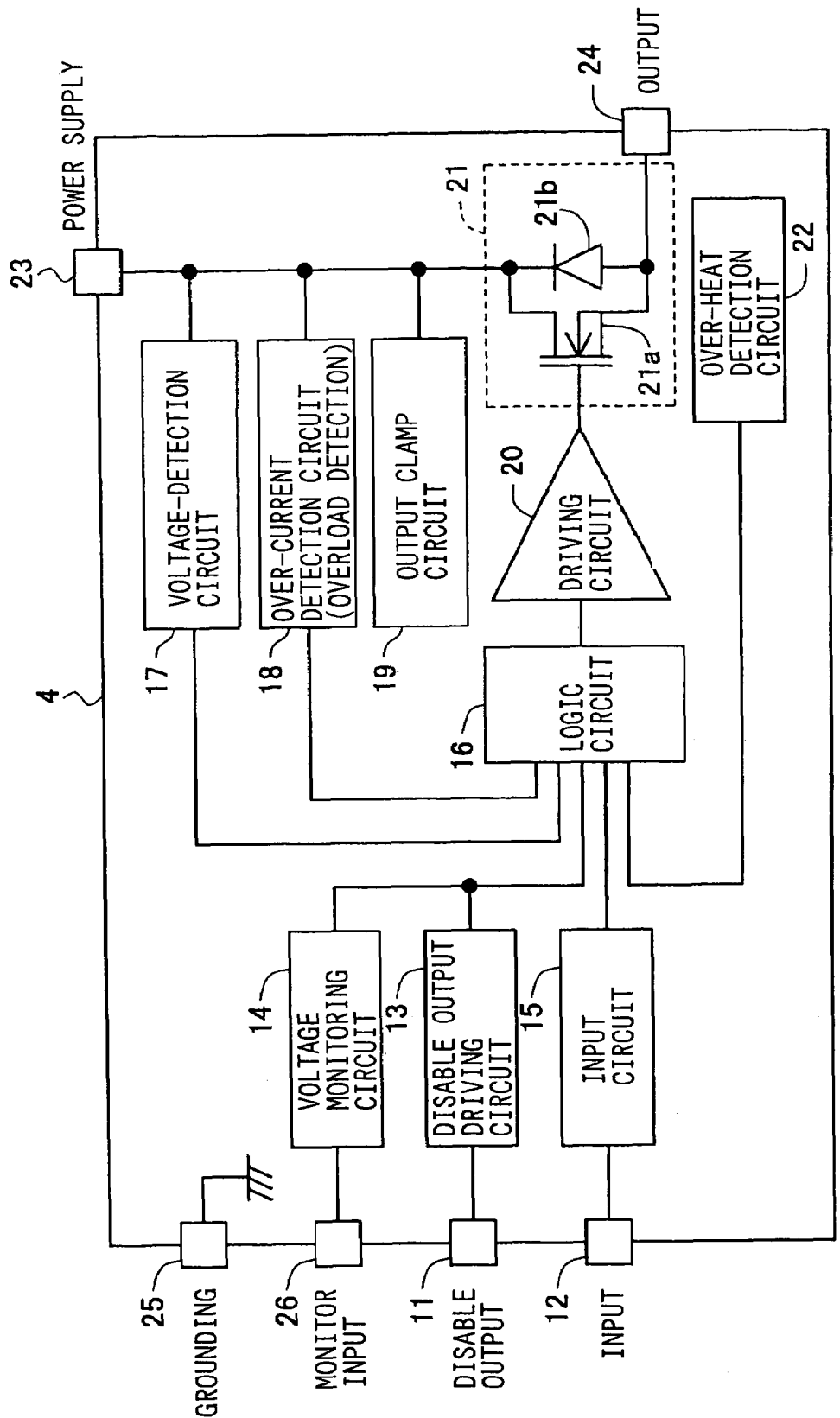
FIG. 2 is a diagram illustrating the constitution of a semiconductor switch according to a first abnormal operation detecting method.

A method of detecting an abnormal operation of the microcomputer 3 with the semiconductor switch 4 will be described with reference to FIGS. 2 and 3. FIG. 2 is a block diagram illustrating the internal constitution of the semiconductor switch 4. When an instruction signal is input to an input terminal 12 from the microcomputer 3 while the ECU 1 and the semiconductor switch 4 are normally operating, an input circuit 15 (feed voltage-monitoring means) judges whether the instruction signal is an on-instruction or an off-instruction. Based on the judged result, a drive circuit 20 operates, whereby a switching circuit 21 made with a MOSFET 21a with a parasitic diode 21b connected in the reverse direction of the power supply, is turned on or off, and the result thereof is output through an output terminal 24.

Figure 3:
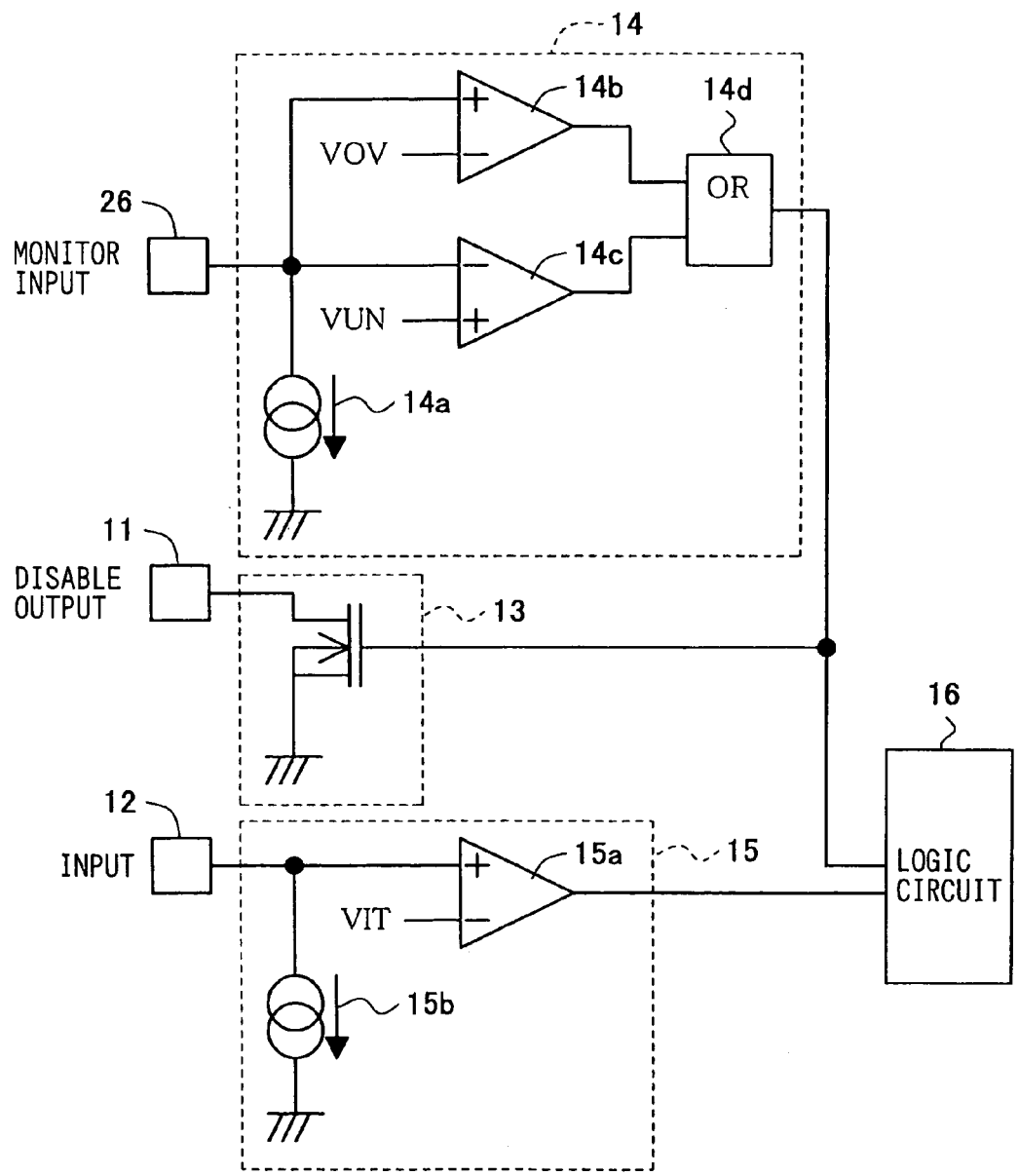
FIG. 3 is a diagram illustrating a voltage-monitoring circuit, a disable output drive circuit and an input circuit of FIG. 2 in detail according to the first abnormal operation detecting method 1.

In the input circuit 15 as illustrated in FIG. 3, the input terminal 12 is connected to a comparator 15a made with a known operational amplifier or the like, and the output of the comparator 15a is sent to a logic circuit 16.

The input voltage from the input terminal 12 is judged to be of the H-level (i.e., on) when it is greater than a reference voltage VIT input to the comparator 15a. The input terminal 12 is, further, grounded through a constant-current circuit 15b. A pull-down resistor may be used instead of the constant-current circuit 15b. Because input terminal 12 is grounded through the constant-current circuit 15b, if the wire breaks between the microcomputer 3 and the input terminal 12, the input voltage becomes 0 V, the comparator 15a judges the voltage to be L-level (i.e., off), and the semiconductor switch 4 is turned off, thus feeding the power supply to neither the increased pressure switch control valve 61 nor to the decreased pressure switch control valve 62.

Returning to FIG. 2, the circuits for detecting an abnormal operation in the semiconductor switch 4 preferably include a voltage-detecting circuit 17 for detecting an abnormal input voltage from a power supply input terminal 25-23, an overcurrent-detecting circuit 18 for detecting an abnormal current flowing through the semiconductor switch 4, and an overheat-detecting circuit 22 for detecting an abnormal temperature of the semiconductor switch 4. Upon detecting abnormal conditions, these circuits send signals (H-level) to the logic circuit 16. An output-clamping circuit 19 fixes the power supply voltage fed through the power supply terminal 23 to a voltage at which the switching circuit 21 operates.

A voltage which is the same as the one fed to the microcomputer 3 is input to a monitor input terminal 26. The voltage is monitored by a voltage-monitoring circuit 14 (feed voltage-monitoring means). Referring to FIG. 3, the voltage-monitoring circuit 14 comprises a constant-current source 14a, an overvoltage-judging circuit 14b (overvoltage-detecting means), an undervoltage-judging circuit 14c (undervoltage-detecting means) and an OR circuit 14d. The overvoltage-judging circuit 14b and the undervoltage-judging circuit 14c are made with known operational amplifiers, and the OR circuit 14d is a known logic circuit. In the overvoltage-judging circuit 14b, when a voltage that is input is greater than a threshold value VOV, the overvoltage-judging circuit 14b outputs the H-level to the OR circuit 14d. When the voltage that is input is smaller than a threshold value VUN, the undervoltage-judging circuit 14c outputs the H-level to the OR circuit 14d. The OR circuit 14d performs the OR operation on the outputs from the overvoltage-judging circuit 14b and the undervoltage-judging circuit 14c, outputs the result thereof to the logic circuit 16 and outputs a signal to an output stoppage terminal 11 for the external peripheral circuit through an output stoppage drive circuit 13 (signal output means).

Further, the monitor input terminal 26 is grounded through a constant-current circuit 14a. A pull-down resistor may be used instead of the constant-current circuit 14a. Because monitor input terminal 26 is grounded through the constant-current circuit 14a, if the wire breaks between the microcomputer 3 and the monitor input terminal 26, the input voltage becomes 0 V, the undervoltage-judging circuit 14c judges voltage to be smaller than the threshold value VUN, and the H-level is output to the logic circuit 16 through the OR circuit 14d.

Returning to FIG. 2, only when the outputs from the voltage-detecting circuit 17, overcurrent-detecting circuit 18, overheat-detecting circuit 22 and voltage-monitoring circuit 14 are all of the L-level (i.e., no abnormal operation is detected) does the logic circuit 16 allow the output from the input circuit 15 (instruction signal from the microcomputer 3) and outputs the H-level (drive permission signal) to the drive circuit 20. Based on the drive permission signal from the logic circuit 16, the drive circuit 20 turns the switching circuit 21 on/off and produces an output to the output terminal 24. When any one of the outputs from the voltage-detecting circuit 17, overcurrent-detecting circuit 18, overheat-detecting circuit 22 and voltage-monitoring circuit 14 is of the H-level (i.e., abnormal operation is detected by any one of them), on the other hand, the logic circuit 16 does not allow the output from the input circuit 15 (instruction signal from the microcomputer 3) and outputs the L-level (drive stoppage signal) to the drive circuit 20. Based on the drive stoppage signal from the logic circuit 16, the drive circuit 20 turns the switching circuit 21 off and, hence, the on/off control based on the instruction signal from the microcomputer 3 is not sent to the output terminal 24. That is, the power supply is fed to neither the increased voltage switch control valve 61 nor the decreased pressure switch control valve 62.

(Abnormal Operation Detection Method 2)

Figure 4:
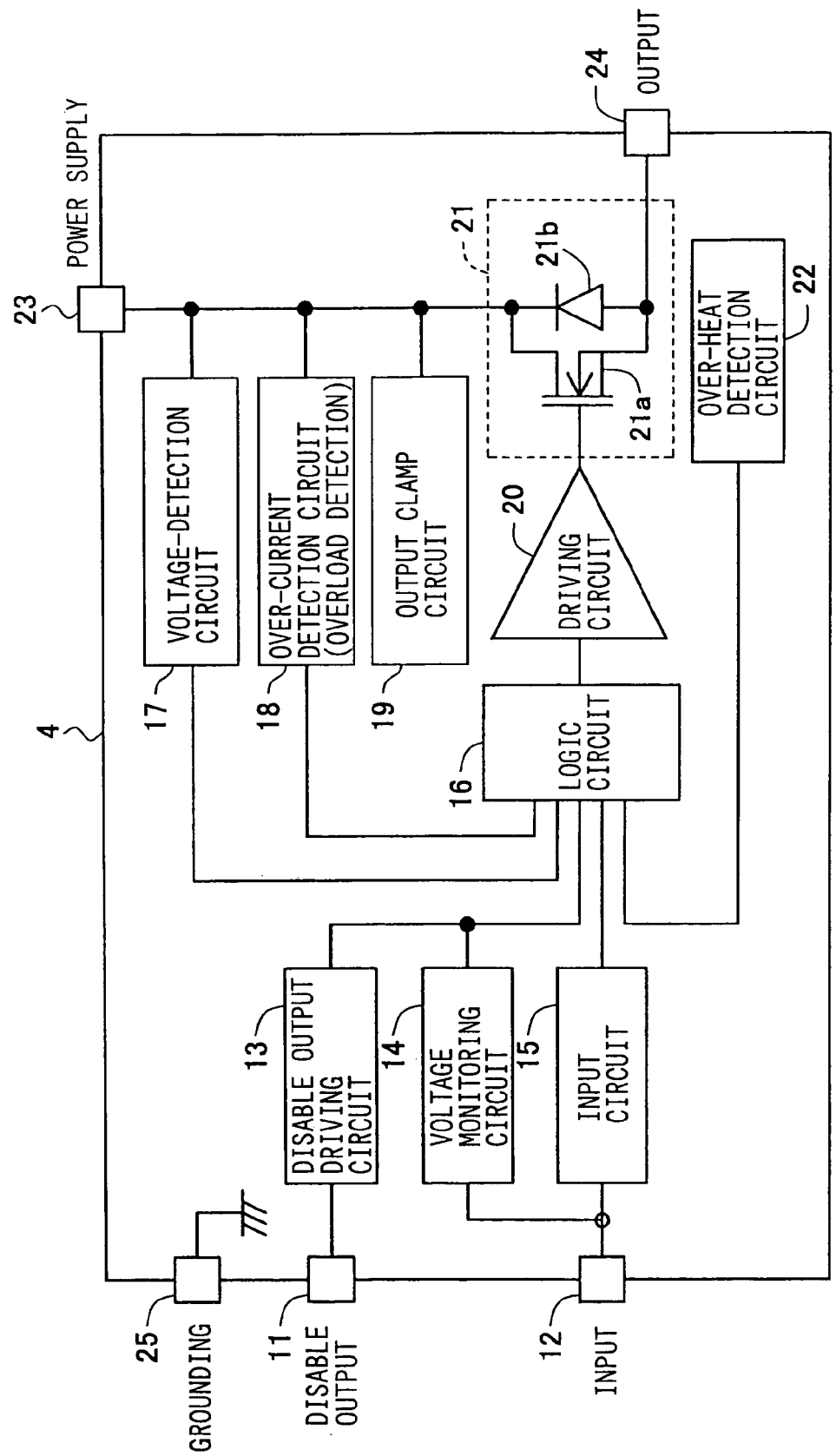
FIG. 4 is a diagram illustrating a modified example of the semiconductor switch according to a second abnormal operation detecting method.
Figure 5:
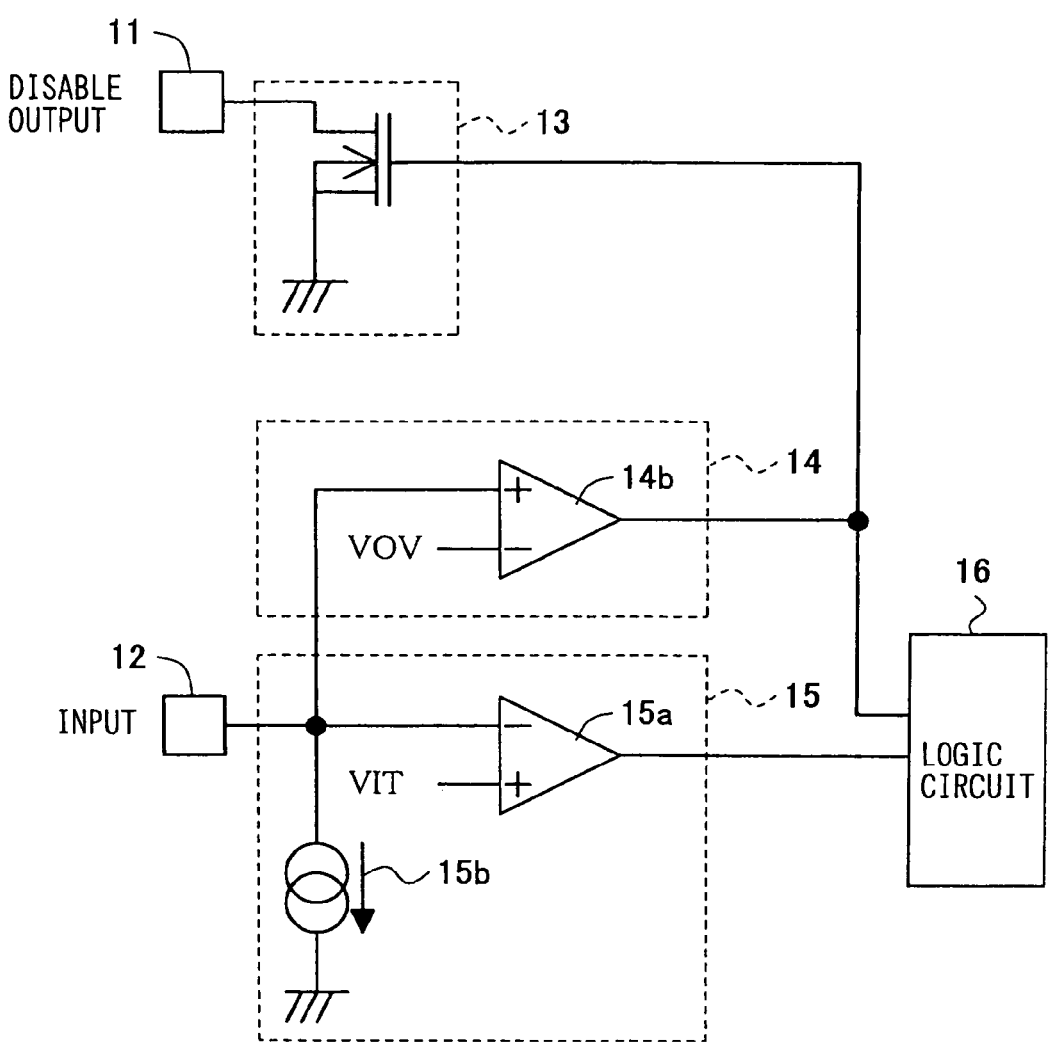
FIG. 5 is a diagram illustrating a voltage-monitoring circuit, a disable output drive circuit and an input circuit of FIG. 4 in detail according to the second abnormal operation detecting method 2.

A method of detecting an abnormal operation of the microcomputer 3 relying upon the semiconductor switch 4 will be described with reference to FIGS. 4 and 5. FIG. 4 is a block diagram illustrating the internal constitution of the semiconductor switch 4. This embodiment is a modification from the abnormal operation detection method 1 described above, and is different in only one part of the circuit constitution. Therefore, the description uses the same reference numerals as those of the abnormal operation detection method 1. When an instruction signal is input to an input terminal 12 from the microcomputer 3 while the ECU 1 and the semiconductor switch 4 are normally operating, an input circuit 15 (output voltage-monitoring means and undervoltage-detecting means) judges whether the instruction signal is an on-instruction or an off-instruction. Based on the judged result, a drive circuit 20 operates whereby a switching circuit 21 comprised of a MOSFET 21a with a parasitic diode 21b connected in the reverse direction of the power supply, is turned on or off, and the result thereof is output through an output terminal 24.

In the input circuit 15, the input terminal 12 is connected to a comparator 15a made with a known operational amplifier or the like, and the output of the comparator 15a is sent to a logic circuit 16. The voltage of the instruction signal from the input terminal 12 is judged to be of the H-level (i.e., on) when it is greater than a reference voltage VIT input to the comparator 15a. The input terminal 12 is, further, grounded through a constant-current circuit 15b. A resistor may be used instead of the constant-current circuit 15b. Because input terminal 12 is grounded through the constant-current circuit 15b, if the wire breaks between the microcomputer 3 and the input terminal 12, the input voltage becomes 0 V, the comparator 15a judges voltage to be of the L-level (i.e., off), and the semiconductor switch 4 is turned off, thus feeding the power supply to neither the increased pressure switch control valve 61 nor the decreased pressure switch control valve 62. That is, even without separately providing undervoltage-detecting means, the input circuit 15 and the constant-current circuit 15b work to exhibit the same effect.

The circuits for detecting an abnormal operation in the semiconductor switch 4 preferably include a voltage-detecting circuit 17 for detecting an abnormal input voltage from a power supply input terminal 23, an overcurrent-detecting circuit 18 for detecting an abnormal current flowing through the semiconductor switch 4, and an overheat-detecting circuit 22 for detecting an abnormal temperature of the semiconductor switch 4. Upon detecting abnormal conditions, these circuits send signals (H-level) to the logic circuit 16. An output-clamping circuit 19 fixes the power supply voltage fed through the power supply terminal 23 to a voltage at which the switching circuit 21 can operate.

The instruction signal input through the input terminal 12 is, further, input to a voltage-monitoring circuit 14 (output voltage-monitoring means). As shown in FIG. 5, the voltage-monitoring circuit 14 includes an overvoltage-judging circuit 14b (overvoltage-detecting mean) made with a known operational amplifier. When the voltage of the instruction signal that is input is greater than a threshold value VOV, the overvoltage-judging circuit 14b outputs the H-level to the logic circuit 16 and, further, outputs a signal to an output stoppage terminal 11 for the external peripheral circuit through an output stoppage drive circuit 13 (signal output means).

Only when the outputs from the voltage-detecting circuit 17, overcurrent-detecting circuit 18, overheat-detecting circuit 22 and voltage-monitoring circuit 14 are all of the L-level (i.e., no abnormal operation is detected), does the logic circuit 16 allow the output from the input circuit 15 (instruction signal from the microcomputer 3) and outputs the H-level (drive permission signal) to the drive circuit 20. Based on the drive permission signal from the logic circuit 16, the drive circuit 20 turns the switching circuit 21 on/off and produces an output to the output terminal 24. When any one of the outputs from the voltage-detecting circuit 17, overcurrent-detecting circuit 18, overheat-detecting circuit 22 and voltage-monitoring circuit 14 is of the H-level (i.e., abnormal operation is detected by any one of them), on the other hand, the logic circuit 16 does not allow the output from the input circuit 15 (instruction signal from the microcomputer 3) and outputs the L-level (drive stoppage signal) to the drive circuit 20. Based on the drive stoppage signal from the logic circuit 16, the drive circuit 20 turns the switching circuit 21 off and, hence, the on/off control based on the instruction signal from the microcomputer 3 is not sent to the output terminal 24. That is, the power supply is fed to neither the increased voltage switch control valve 61 nor the decreased pressure switch control valve 62.

Though the invention was described above by way of embodiments, it should be noted that the invention is in no way limited thereto only but can be modified in a variety of ways based on the knowledge of people skilled in the art without departing from the spirit and scope of the invention set forth in the claims.

What is claimed is:

1. A semiconductor switch, comprising:
   a switching element;
   a control device for outputting a control signal to the switching element;
   an IC for supplying a control voltage to the control device;
   a power source for supplying a supply voltage to the switching element and the IC;
   wherein the control device is supplied with the control voltage within a predetermined range from the IC so that the control device outputs the control signal,
   wherein the switching element is turned on or off based upon the control signal from the control device,
   wherein the switching element includes a feed voltage-monitoring circuit for monitoring whether the control voltage fed from the IC to the control device is within the predetermined range,
   wherein the switching element further includes a driving circuit,
   wherein the driving circuit controls the switching element to be turned off when it is judged by the feed voltage-monitoring circuit that the control voltage is not within the predetermined range, and
   wherein the feed voltage monitoring circuit and the driving circuit are independently disposed from the IC.

2. A semiconductor switch comprising:
   a switching element;
   a control device for outputting a control signal to the switching element;
   an IC for supplying a control voltage to the control device;
   a power source for supplying a supply voltage to the switching element and the IC;
   wherein the control device is supplied with the control voltage from the IC so that the control device outputs the control signal having a voltage within a predetermined range,
   wherein the switching element is turned on or off depending upon the control signal from the control device,
   wherein the switching element includes an output voltage-monitoring circuit for monitoring whether the voltage of the control signal output to the switching element from the control device is within the predetermined range,
   wherein the switching element further includes a driving circuit,
   wherein the driving circuit controls the switching element to be turned off when it is judged by the output voltage-monitoring circuit that the voltage of the control signal is not within the predetermined range, and
   wherein the output voltage-monitoring circuit and the driving circuit are independently disposed from the IC.

3. A semiconductor switch according to claim 1, wherein the feed voltage monitoring circuit includes:
   overvoltage-detecting circuit for detecting if the control voltage applied to the control device is greater than a predetermined value; and
   undervoltage-detecting circuit for detecting if the control voltage applied to the control device is smaller than a predetermined value, wherein the feed voltage monitoring circuit monitors if the control voltage applied to the control device is greater than the predetermined value or is smaller than the predetermined value.

4. A semiconductor switch according to claim 2, wherein the output voltage monitoring circuit includes:
   overvoltage-detecting circuit for detecting if the voltage of the control signal output to the switching element from the control device is greater than a predetermined value; and
   undervoltage-detecting circuit for detecting if the voltage of the control Signal output to the switching element from the control device is smaller than a predetermined value,
   wherein the output voltage monitoring circuit monitors if the voltage of the control signal output to the switching element from the control device is greater than the predetermined value or is smaller than the predetermined value.

5. A semiconductor switch according to claim 1, wherein the switching element further includes a signal output terminal for outputting a signal to an external unit when it is judged that the control voltage is not within a predetermined range.

6. A semiconductor switch according to claim 2, wherein the switching element further includes a signal output terminal for outputting a signal to an external unit when it is judged that the voltage of the control signal is not within a predetermined range.

7. A semiconductor switch according to claim 1, wherein the switching element is implemented within an anti-lock braking device for an automobile, the anti-lock braking device comprising a fluid pressure pump driven by an electric motor, and a feed side electromagnetic valve and a drain side electromagnetic valve provided for each of the wheels between the fluid pressure pump and a wheel cylinder, for adjusting the pressure of the brake fluid fed from the fluid pressure pump to the wheel cylinder, wherein the switching element is connected at least either between a power supply feeder line and a drive circuit for the feed side electromagnetic valve or between the power supply feeder line and the drive circuit for a drain side electromagnetic valve.

8. A semiconductor switch according to claim 2, wherein the switching element is implemented within an anti-lock braking device for an automobile, the anti-lock braking device comprising a fluid pressure pump driven by an electric motor, and a feed side electromagnetic valve and a drain side electromagnetic valve provided for each of the wheels between the fluid pressure pump and a wheel cylinder, for adjusting the pressure of the brake fluid fed from the fluid pressure pump to the wheel cylinder, wherein the switching element is connected at least either between a power supply feeder line and a drive circuit for the feed side electromagnetic valve or between the power supply feeder line and the drive circuit for the drain side electromagnetic valve.

9. A semiconductor switch according to claim 1, wherein
the feed-monitoring circuit monitors the control voltage flowing from the IC to the control device, and
the IC converts the supply voltage outputted from the power source to a predetermined voltage, and outputs the predetermined voltage as the control voltage to the control device.

10. A semiconductor switch according to claim 9, wherein
the control device is a microcomputer, and
the switching element, the control device and the IC provide an ECU for controlling an actuator unit.

11. A semiconductor switch according to claim 2, wherein
the output voltage-monitoring circuit monitors the voltage of the control signal flowing from the control device to the switching element, and
the IC converts the supply voltage outputted from the power source to a predetermined voltage, and outputs the predetermined voltage as the control voltage to the control device.

12. A semiconductor switch according to claim 11, wherein
the control device is a microcomputer; and
the switching element, the control device and the IC provide an ECU for controlling an actuator unit.

* * * * *